United States Patent
Nagano

(10) Patent No.: US 11,315,808 B2
(45) Date of Patent: Apr. 26, 2022

(54) FRAME FEEDER

(71) Applicant: SHINKAWA LTD., Tokyo (JP)

(72) Inventor: Kazuaki Nagano, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/650,378

(22) PCT Filed: Jul. 31, 2018

(86) PCT No.: PCT/JP2018/028700
§ 371 (c)(1),
(2) Date: May 21, 2020

(87) PCT Pub. No.: WO2019/026916
PCT Pub. Date: Feb. 7, 2019

(65) Prior Publication Data
US 2021/0242045 A1 Aug. 5, 2021

(30) Foreign Application Priority Data

Aug. 1, 2017 (JP) .............................. JP2017-148942

(51) Int. Cl.
*B65G 51/02* (2006.01)
*H01L 21/67* (2006.01)
(Continued)

(52) U.S. Cl.
CPC ......... *H01L 21/67103* (2013.01); *F24H 3/04* (2013.01); *H01L 24/78* (2013.01);
(Continued)

(58) Field of Classification Search
CPC ...... B65G 19/225; B65G 51/02; B65G 51/03; F24H 3/04; H01L 21/67103
See application file for complete search history.

(56) References Cited

U.S. PATENT DOCUMENTS 3,395,943 A * 8/1968 Wilde .................... B65G 51/03
406/88
3,731,823 A * 5/1973 Goth ...................... B65G 51/03
406/88

(Continued)

FOREIGN PATENT DOCUMENTS

JP       S5423565       2/1979
JP       H0252334       4/1990
(Continued)

OTHER PUBLICATIONS

"International Search Report (Form PCT/ISA/210) of PCT/JP2018/028700," dated Oct. 30, 2018, with English translation thereof, pp. 1-3.

(Continued)

*Primary Examiner* — Gregory A Wilson
(74) *Attorney, Agent, or Firm* — JCIPRNET

(57) ABSTRACT

The present invention includes: a heat plate for heating a lower side of a substrate sliding on an upper surface; and a heat block for heating the heat plate. The heat block includes an air heating flow path for heating air which flows in from a bottom surface side and causing the air to flow out to the heat plate side, the heat plate includes air holes for discharging the air heated by the air heating flow path from the upper surface, the heated air discharged from the air holes forms a heated air atmosphere above the heat plate, and the substrate is transported through the heat air atmosphere. Thereby, curved deformation of the substrate is suppressed.

9 Claims, 3 Drawing Sheets

(51) Int. Cl.
*F24H 3/04* (2022.01)
*H01L 23/00* (2006.01)
(52) U.S. Cl.
CPC .............. *H01L 2224/78251* (2013.01); *H01L 2224/78744* (2013.01)

(56) References Cited

U.S. PATENT DOCUMENTS

| | | | | |
|---|---|---|---|---|
| 5,524,361 A * | 6/1996 | Dexter | .................... | F26B 17/04 34/500 |
| 6,336,775 B1 * | 1/2002 | Morita | ................. | B65G 49/065 198/721 |
| 8,042,727 B2 * | 10/2011 | Shirai | ................. | F27B 17/0025 228/234.1 |
| 8,579,284 B2 * | 11/2013 | Herrmann | .............. | B65H 9/101 271/236 |
| 8,965,185 B2 * | 2/2015 | Doherty | ................. | F26B 15/12 392/411 |
| 10,118,246 B2 | 11/2018 | Hayata et al. | | |
| 10,738,382 B2 * | 8/2020 | Granneman | ...... | C23C 16/45551 |
| 2020/0126834 A1 * | 4/2020 | Yamaguchi | ............. | F25B 13/00 |

FOREIGN PATENT DOCUMENTS

| | | |
|---|---|---|
| JP | H1126493 | 1/1999 |
| JP | 2016127085 | 7/2016 |

OTHER PUBLICATIONS

"International Preliminary Report On Patentability (Form PCT/IPEA/409) of PCT/JP2018/028700," completed on Aug. 8, 2019, with English translation thereof, pp. 1-7.

* cited by examiner

FRAME FEEDER

CROSS-REFERENCE TO RELATED APPLICATION

This application is a 371 application of the International PCT application serial no. PCT/JP2018/028700, filed on Jul. 31, 2018, which claims the priority benefit of Japanese Patent Application No. 2017-148942, filed on Aug. 1, 2017. The entirety of each of the above-mentioned patent applications is hereby incorporated by reference herein and made a part of this specification.

BACKGROUND OF THE INVENTION

Technical Field

The present invention relates to the structure of a frame feeder that heats and transports a substrate in a die bonding device, a wire bonding device or the like.

Related Art

In a wire bonding device and a die bonding device, a frame feeder is used which transports a substrate stored in a magazine to a bonding stage while heating the substrate and transports the substrate from the bonding stage to a product magazine after completion of bonding (for example, see patent literature 1 (Japanese Patent Application Laid-Open No. 2016-127085)).

The substrate is heated by the frame feeder to, for example, about 200° C., and then the substrate is suctioned to a bonding stage heated to about 200° C. to perform bonding. The substrate after the completion of the bonding is carried out of the bonding stage while being maintained at the temperature of about 200° C. and is stored in the product magazine after the temperature is reduced.

SUMMARY

Problems to be Solved

Meanwhile, in recent years, substrates having a smaller thickness, a wider width and a longer length have been used. In this case, when the substrate is heated and transported, the substrate may be deformed in a curved manner, and appropriate bonding cannot be performed.

Therefore, the present invention is to suppress curved deformation of a substrate in a frame feeder.

The frame feeder of the present invention heats and transports a substrate and includes: a heat plate for heating a lower side of the substrate sliding on an upper surface; and a heat block which is laminated on a lower side of the heat plate and heats the heat plate. The heat block includes an air heating flow path for heating air which flows in from a bottom surface side and causing the air to flow out to the heat plate side, the heat plate includes air holes for discharging the air heated by the air heating flow path of the heat block from the upper surface, and the heated air discharged from the air holes forms a heated air atmosphere above the heat plate, and the substrate is transported through the heated air atmosphere. A flow rate of the air flowing through the air heating flow path is a flow rate at which a temperature of the heated air discharged from the air holes is substantially the same as a temperature of the upper surface of the heat plate.

In the frame feeder of the present invention, the air heating flow path of the heat block may be a labyrinth flow path including at least one turn, and a plurality of the air holes in the heat plate may be arranged side by side in a direction intersecting a transport direction of the substrate.

In the frame feeder of the present invention, the heat plate may be configured by a material having a thermal diffusivity of $1 \times 10^{-5}$ to $8 \times 10^{-5}$ (m$^2$/sec).

In the frame feeder of the present invention, a flow rate of the air flowing through the air heating flow path may be a flow rate at which a temperature of the heated air discharged from the air holes is substantially the same as a temperature of the upper surface of the heat plate.

The present invention can suppress the curved deformation of the substrate in the frame feeder.

DESCRIPTION OF THE EMBODIMENTS

Figure 1:
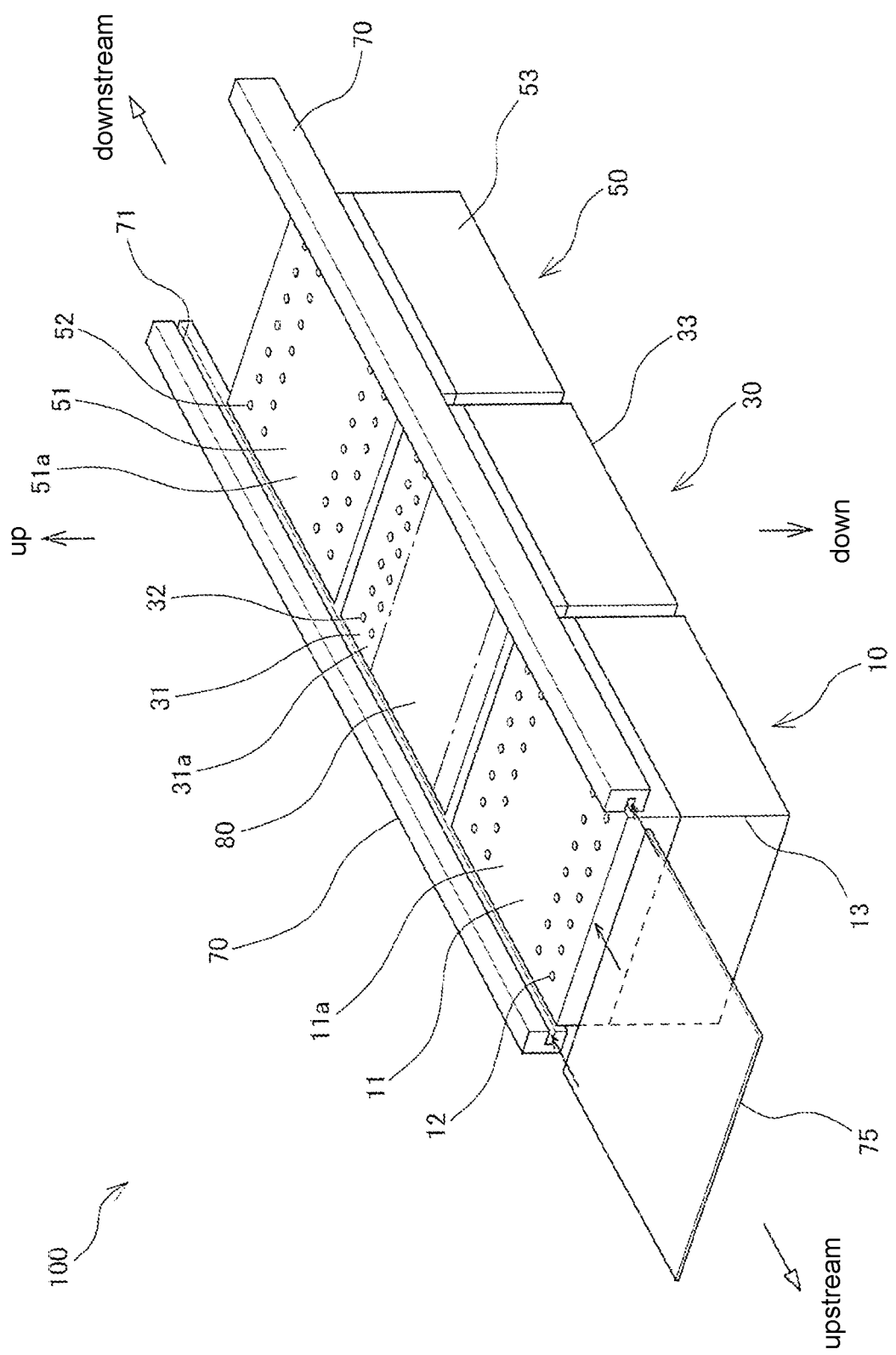
FIG. 1 is a perspective view of a frame feeder according to an embodiment of the present invention.

A frame feeder 100 of the embodiment is described below with reference to the drawings. As shown in FIG. 1, the frame feeder 100 of the embodiment includes guide rails 70 in which grooves 71 for guiding the substrate 75 are arranged, and a first unit 10, a second unit 30, and a third unit 50 which are arranged side by side from an upstream side of a transport direction of the substrate 75 toward the transport direction. The frame feeder 100 heats and transports the substrate 75 from the upstream side toward the downstream side.

Figure 2:
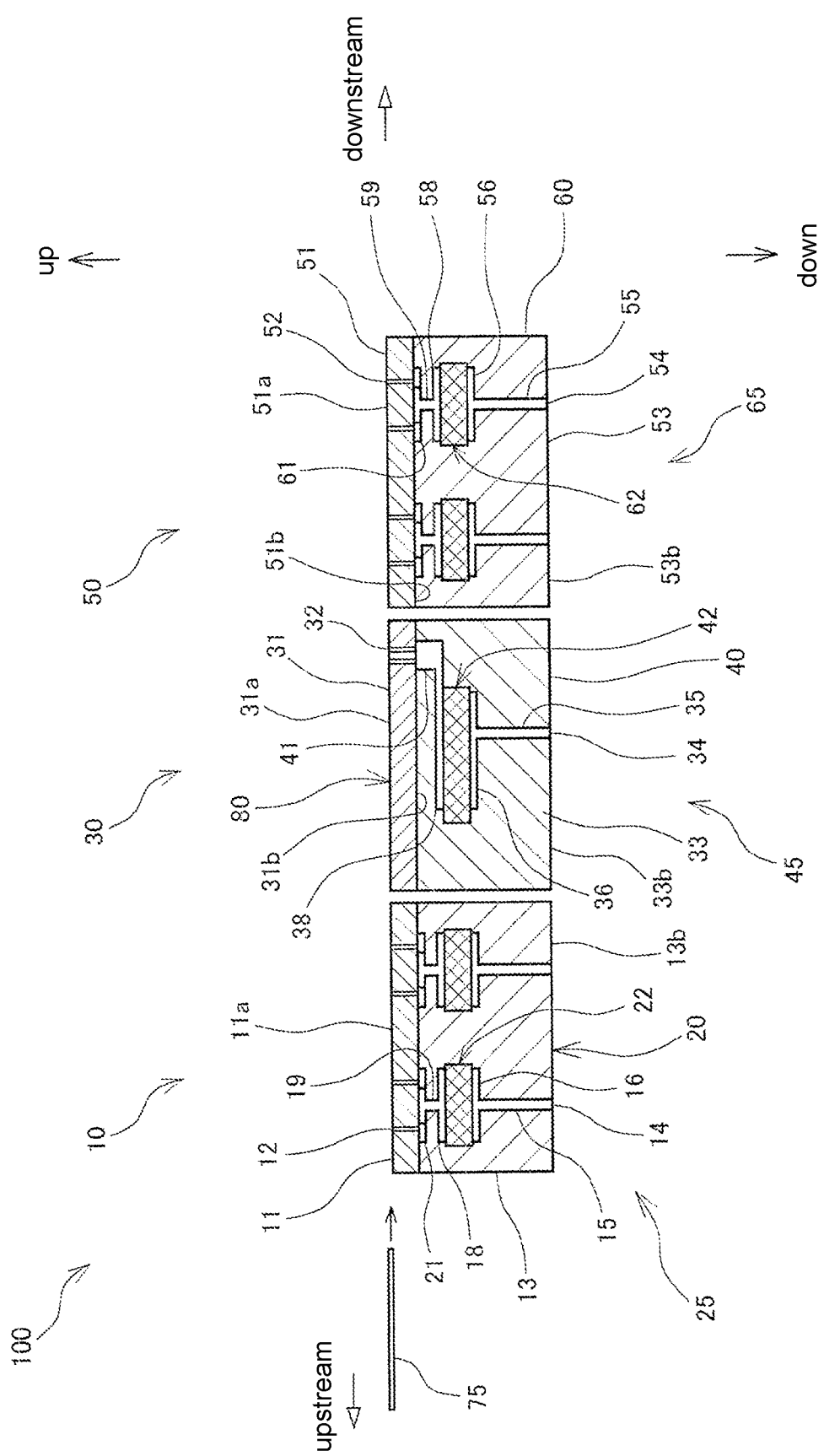
FIG. 2 is a side cross-section view of the frame feeder shown in FIG. 1.
Figure 3:
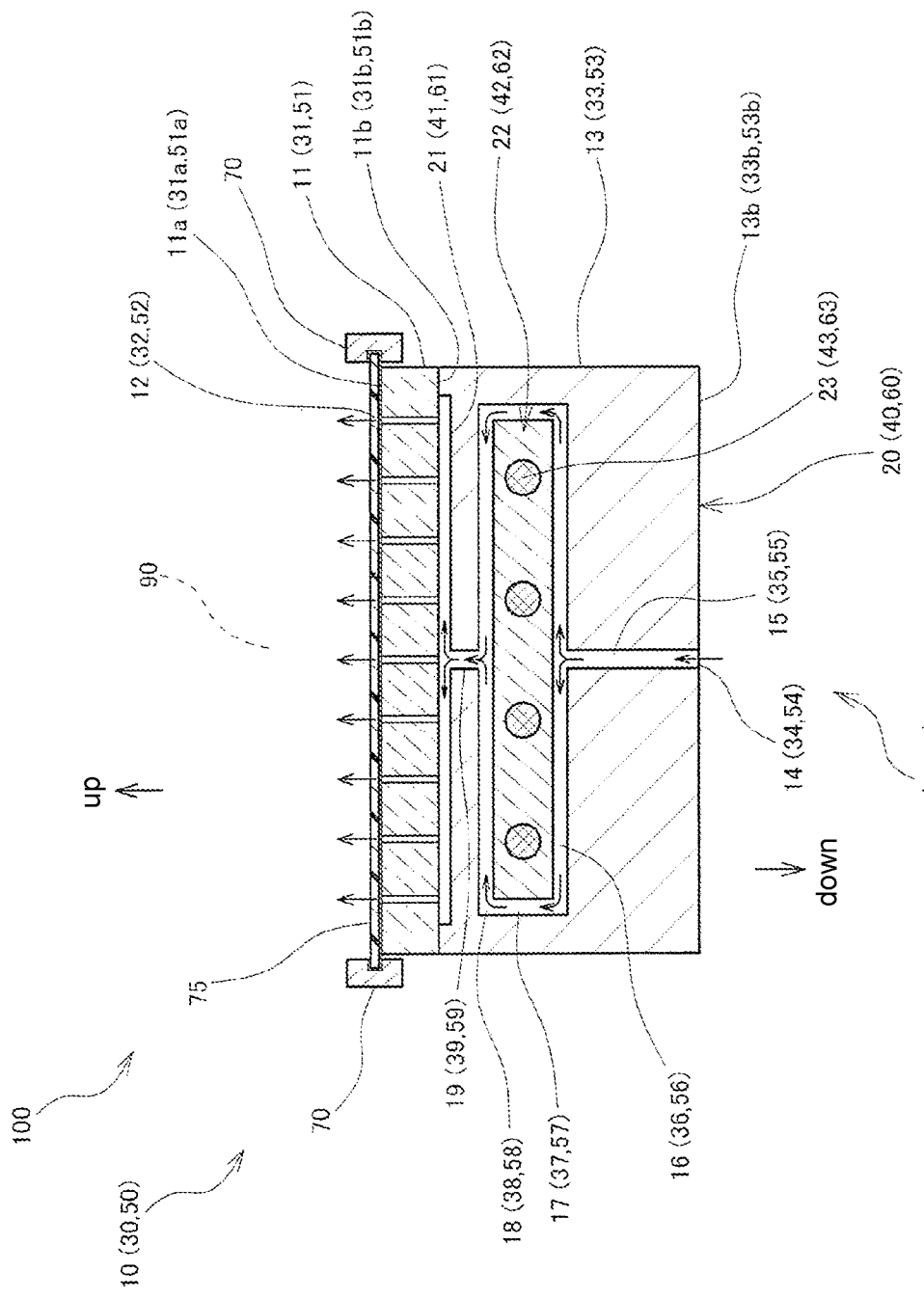
FIG. 3 is a cross-section view of the frame feeder shown in FIG. 1 in a direction perpendicular to a transport direction.

As shown in FIGS. 2 and 3, the first unit 10 includes a heat plate 11 and a heat block 20 which are vertically laminated. The heat plate 11 is a metal flat plate having an upper surface 11a on which the substrate 75 slides, and a plurality of air holes 12 is arranged side by side in the upper surface 11a in a direction intersecting the transport direction of the substrate 75. In the embodiment, the heat plate 11 is configured by, for example, a metal material such as a Corson alloy or the like having a thermal diffusivity of $1 \times 10^{-5}$ to $8 \times 10^{-5}$ (m$^2$/sec).

The heat block 20 includes a main body 13, heater assemblies 22 disposed inside the body 13, and an air heating flow path 25. As shown in FIG. 3, the heater assembly 22 is a rectangular parallelepiped in which a plurality of cartridge heaters 23 is disposed, and the heater assembly 22 emits heat from a surface thereof. The air heating flow path 25 includes an air inlet flow path 15 that communicates with an air inlet 14 disposed on a bottom surface 13b of the main body 13, a lower air flow path 16 that allows air to flow on a lower surface of the heater assembly 22, an upper air flow path 18 that allows the air to flow on an upper surface of the heater assembly 22, a connection flow path 17 connecting the lower air flow path 16 and the upper air flow path 18, a header 21 configured by a shallow groove disposed on a lower surface 11b of the heat plate 11, and a connection flow path 19 connecting the header 21 and the upper air flow path 18. The air heating flow path 25 is a flow path that heats the air which flows in from the bottom surface 13b side and causes the air to flow out to the heat plate 11 side.

The lower air flow path 16, the connection flow path 17 and the upper air flow path 18 configures a labyrinth flow path including at least one turn along the surfaces of the heater assembly 22.

The plurality of air holes 12 of the heat plate 11 penetrates in a thickness direction of the heat plate 11 and is communicated with the header 21 of the heat block 20.

The second unit 30 has the same structure as the first unit 10 and has a heat plate 31 and a heat block 40 vertically laminated therein. The second unit 30 includes, inside the heat block 40, a heater assembly 42 and an air heating flow path 45 configured by flow paths 35 to 39 and a header 41. Moreover, at the center of the second unit 30, a bonding stage 80 for vacuum suctioning the substrate 75 and performing bonding is arranged.

The third unit 50 also has the same configuration as the first unit 10 and has a heat plate 51 and a heat block 60 vertically laminated therein. The third unit 50 includes, inside the heat block 60, heater assemblies 62 and an air heating flow path 65 configured by flow paths 55 to 59 and a header 61.

An operation of the frame feeder 100 configured as described above is described. In the embodiment, the description is made on the premise that the heater assembly 22 on the upstream side in the transport direction of the first unit 10 heats the heat plate 11 on an upper part of the heater assembly 22 to about 100° C., and the heater assembly 22 on the downstream side in the transport direction of the first unit 10 heats the heat plate 11 on the upper part of the heater assembly 22 to about 200° C. In addition, the description is made on the premise that the heater assembly 42 of the second unit 30 and the heater assembly 62 of the third unit 50 heat the heat plates 31 and 51 on an upper part of the heater assembly to about 200° C., respectively.

As shown in FIG. 3, the air flowing in from the air inlet 14 disposed on the bottom surface 13b of the first unit 10 flows in from the air inlet flow path 15 into the lower air flow path 16 and is heated by the lower surface of the heater assembly 22. The heated air flows into the upper air flow path 18 through the connection flow path 17 and is further heated by the upper surface of the heater assembly 22. The heated air flows into the air holes 12 of the heat plate 11 from the header 21 through the connection flow path 19 and is discharged from the air holes 12 toward the above of the heat plate 11. The discharged heated air forms a heated air atmosphere 90 above the upper surface 11a of the heat plate 11. In addition, the upper surface of the heat plate 11 is open to the atmosphere, and the air holes 12 diffuse the formed heated air atmosphere 90 to the surroundings.

On the other hand, the heater assembly 22 heats the heat plate 11 from below. Because a flow rate of the air flowing through the air heating flow path 25 is adjusted to a flow rate at which the temperature of the air discharged from the air holes 12 becomes the same as the temperature of the corresponding part of the heat plate 11, a temperature of the upper surface 11a of the heat plate 11 and the temperature of the air blown out from the air holes 12 are substantially the same.

Therefore, in the upstream part of the first unit 10, the temperature of the upper surface 11a of the heat plate 11 is about 100° C., and the temperature of the air blown out from the air holes 12 is also about 100° C. In addition, in the downstream part of the first unit 10, the temperature of the upper surface 11a of the heat plate 11 is about 200° C., and the temperature of the air blown out from the air holes 12 is also about 200° C. Similarly, in the second unit 30 and the third unit 50, temperatures of upper surfaces 31a and 51a of the heat plates 31 and 51 and a temperature of the air blown out from the air holes 32 and 52 are all about 200° C.

As shown in FIG. 2, when the substrate 75 enters the first unit 10 from the upstream side, the substrate 75 slides across the upper surface 11a of the heat plate 11, and a lower side of the substrate 75 is heated. In addition, because the substrate 75 passes through the heated air atmosphere 90 shown in FIG. 3, an upper side of the substrate 75 is heated. Because the temperature of the upper surface 11a of the heat plate 11 and a temperature of the heated air atmosphere 90 are both about 100° C., the substrate 75 is uniformly heated from the upper side and the lower side. Thus, there is almost no temperature difference between temperatures of the upper side and the lower side of the substrate 75, and the substrate 75 is heated without curved deformation.

When the substrate 75 heated to about 100° C. is transported from the upstream side to the downstream side of the first unit 10, the substrate 75 is heated to about 200° C. by the upper surface 11a of the heat plate 11 of about 200° C. and the heated air atmosphere 90 of about 200° C. At this time, because there is also almost no temperature difference between the temperatures of the upper side and the lower side of the substrate 75, the substrate 75 is heated to about 200° C. without curved deformation.

The substrate 75 heated to about 200° C. is transported to the second unit 30 and is vacuum-suctioned to the bonding stage 80 of the second unit 30, and a semiconductor element, a wire, or the like is bonded to the substrate 75. The substrate 75 after the completion of the bonding is transported to the third unit 50. In the third unit 50, similarly to the downstream side of the first unit 10, the substrate 75 is maintained at the temperature of about 200° C. by the upper surface 51a of the heat plate 51 of about 200° C. and the heated air atmosphere 90 of about 200° C., and the substrate 75 is transported downstream. As described above, because the temperature of the substrate 75 can be maintained at about 200° C. even after the bonding is completed, the deformation of the substrate 75 after the bonding can be suppressed.

As described above, in the frame feeder 100 of the embodiment, the temperature of the heated air discharged from the air holes 12 and the temperature of the upper surface 11a of the heat plate 11 can be made substantially the same by the labyrinth-shaped air heating flow path 25, and thus the thin substrate 75 can be heated while the curved deformation thereof is suppressed.

In addition, in the embodiment, because the material of the heat plate 11 is a metal material such as the Corson alloy having a thermal diffusivity of $1 \times 10^{-5}$ to $8 \times 10^{-5}$ (m²/sec), the heat diffusion from the heat plate 11 to the substrate 75 can be great, and a heating speed of the substrate 75 can be increased. Thus, the substrate 75 can be transported at a higher transport speed than before without causing the substrate 75 to curve and deform.

Moreover, a cover member that covers the transport path may be arranged on the upper surface of the frame feeder 100. The cover member can form a closed path on the upper surface of the frame feeder 100 and expel oxygen in the closed path by blowing out nitrogen from the air holes. Therefore, by arranging the cover member, oxidation of the heated substrate 75 can be suppressed without causing the substrate 75 to curve and deform.

What is claimed is:
1. A frame feeder for heating and transporting a substrate, comprising:
a heat plate for heating a lower side of the substrate sliding on an upper surface of the heat plate; and a heat block which is attached to a lower side of the heat plate and heats the heat plate, wherein the heat block comprises an air heating flow path for heating air which flows in from a bottom surface side and causing the air to flow out to the heat plate side, the heat plate comprises air holes for discharging the air heated by the air heating flow path of the heat block from the upper surface, and the heated air discharged from the air holes forms a heated air atmosphere above the heat plate, and the substrate is transported through the heated air atmosphere, a flow rate of the air flowing through the air heating flow path is a flow rate at which a temperature of the heated air discharged from the air holes is substantially the same as a temperature of the upper surface of the heat plate.

2. The frame feeder according to claim 1, wherein the air heating flow path of the heat block is a labyrinth flow path comprising at least one turn.

3. The frame feeder according to claim 2, wherein the upper surface of the heat plate is open to the atmosphere, and the air holes diffuse the heated air atmosphere to surroundings.

4. The frame feeder according to claim 2, wherein the heat plate is formed by a material having a thermal diffusivity of $1 \times 10^{-5}$ to $8 \times 10^{-5}$ (m$^2$/sec).

5. The frame feeder according to claim 2, wherein a plurality of the air holes in the heat plate is arranged side by side in a direction intersecting a transport direction of the substrate.

6. The frame feeder according to claim 5, wherein the heat plate is formed by a material having a thermal diffusivity of $1 \times 10^{-5}$ to $8 \times 10^{-5}$ (m$^2$/sec).

7. The frame feeder according to claim 1, wherein the heat plate is formed by a material having a thermal diffusivity of $1 \times 10^{-5}$ to $8 \times 10^{-5}$ (m$^2$/sec).

8. The frame feeder according to claim 7, wherein the upper surface of the heat plate is open to the atmosphere, and the air holes diffuse the heated air atmosphere to surroundings.

9. The frame feeder according to claim 1, wherein the upper surface of the heat plate is open to the atmosphere, and the air holes diffuse the heated air atmosphere to surroundings.

\* \* \* \* \*